(12) United States Patent
Schmidt et al.

(10) Patent No.: US 7,109,917 B2
(45) Date of Patent: Sep. 19, 2006

(54) INTERGRATED SEMICONDUCTOR COMPONENT FOR HIGH-FREQUENCY MEASUREMENT AND USE THEREOF

(75) Inventors: Ewald Schmidt, Ludwigsburg (DE); Heinz Pfizenmaier, Murrhardt (DE); Hans Irion, Winnenden (DE); Juergen Hasch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 214 days.

(21) Appl. No.: 10/494,660

(22) PCT Filed: Aug. 16, 2002

(86) PCT No.: PCT/DE02/03004

§ 371 (c)(1),
(2), (4) Date: Sep. 3, 2004

(87) PCT Pub. No.: WO03/041117

PCT Pub. Date: May 15, 2003

(65) Prior Publication Data

US 2005/0001632 A1   Jan. 6, 2005

(30) Foreign Application Priority Data

Nov. 9, 2001 (DE) ................................. 101 56 258

(51) Int. Cl.
*G01S 7/28* (2006.01)
*G01S 13/93* (2006.01)
(52) U.S. Cl. ........................................ 342/175; 342/70
(58) Field of Classification Search ............ 342/70–72, 342/175; 340/903, 435, 436; 257/604; 331/105, 331/107 DP, 107 R, 1 R, 56, 84, 96, 99
See application file for complete search history.

(56) References Cited

U.S. PATENT DOCUMENTS 3,882,419 A * 5/1975 Swartz et al. ................. 331/96
4,514,707 A * 4/1985 Dydyk et al. ............. 331/107 SL (Continued)

FOREIGN PATENT DOCUMENTS

DE    199 31 928 A1    1/2001

(Continued)

OTHER PUBLICATIONS

"Monolithic millimeter-wave IMPATT oscillator and active antenna", Camilleri, N.; Bayraktaroglu, B. Microwave Theory and Techniques, IEEE Transaction on vol. 36, Issue 12, Dec. 1988 Ps:1670-1676.*

(Continued)

*Primary Examiner*—John B. Sotomayor
(74) *Attorney, Agent, or Firm*—Michael J. Striker (57) ABSTRACT

It is provided that the semiconductor component is a component of a semiconductor circuit (10) comprising a first silicon layer (12), an adjoining silicon dioxide layer (insulating layer (14)) and a subsequent further silicon layer (structured layer (16)) (SOI wafer), and the semiconductor component comprises an IMPATT oscillator (30), having a resonator (24) which includes a metallized cylinder (18) of silicon, disposed in the structured layer (16); a coupling disk (28) covering the cylinder (18) in the region of the first layer (12); and an IMPATT diode (32), communicating with the cylinder (18) of the resonator (24) via a recess (38) in the coupling disk (28); and a reference oscillator (46) of lower frequency, having a resonator (24) which includes a metal cylinder (18) of silicon, disposed in the structured layer (16), and coupling disk (28) covering the cylinder in the region of the first layer (12); and a microwave conductor, communicating with the cylinder (18) of the resonator (24) via a recess (38) in the coupling disk (28), and the reference oscillator, via an active oscillator circuit (58), serves the purpose of frequency stabilization of the IMPATT oscillator (30); with integrated Schottky diodes; and a transmitting and receiving antenna (49).

20 Claims, 9 Drawing Sheets

U.S. PATENT DOCUMENTS

| | | | |
|---|---|---|---|
| 4,731,611 A * | 3/1988 | Muller et al. | 342/28 |
| 4,982,168 A * | 1/1991 | Sigmon et al. | 331/107 SL |
| 5,204,641 A * | 4/1993 | Fiedziuszko et al. | 331/96 |
| 5,432,482 A * | 7/1995 | Bailey | 331/56 |
| 5,511,238 A * | 4/1996 | Bayraktaroglu | 455/81 |
| 6,094,158 A * | 7/2000 | Williams | 342/70 |
| 6,133,795 A * | 10/2000 | Williams | 331/9 |
| 6,366,235 B1 | 4/2002 | Mayer et al. | 342/70 |
| 2004/0046234 A1* | 3/2004 | Pfizenmaier et al. | 257/604 |
| 2005/0001632 A1* | 1/2005 | Schmidt et al. | 324/644 |

FOREIGN PATENT DOCUMENTS

| | | |
|---|---|---|
| EP | 0 424 509 B1 | 12/1994 |
| EP | 0 978 729 A2 | 2/2000 |
| EP | 0995126 A * | 4/2000 |

OTHER PUBLICATIONS

"Recent investigations into W-band pulsed IMPATT oscillator design", Pearson, G.A. Solid State Components for Radar, IEE Colloquium on Feb. 12, 1988 Ps:1-6.*

"Silicon monolithic millimeter wave integrated oscillators", Luy, J.-F.; Konig, U.; Strohm, K.M.; Buechler, J. Microwave and Millimetre Wave Monolithic Integrated Circuits, IEE Colloquim on Nov. 11, 1988 pp. :10/1-10/4.*

"A monolithic integrated millimeter wave transmitter for automotive applications", Stiller, A.; Biebl, E.M.; Luy, J.-F.; Strohm, K.M.; Buechler, J. Microwave Theory and Techniques, IEEE Transactions on vol. 43, Issue 7, Jul. 1995 Ps:1654-1658.*

W. Widmann, et al: Technolgie Hochintegrierter Schaltung,2, Auflage, 1996, Springer Verlag, pp. 87-88 (English Translation is Provided).

Lablank et al: "Gaas Monolithic Circuit for . . . ", IEEE MTT-S Digest, 1998. (in English).

* cited by examiner

INTERGRATED SEMICONDUCTOR COMPONENT FOR HIGH-FREQUENCY MEASUREMENT AND USE THEREOF

PRIOR ART

Semiconductor technology is increasingly being used in the automotive field. Miniaturization not only makes improved control and regulating technology for motor-specific functions possible but also opens up the path to new safety and riding comfort systems, such as parking aids, precrash and side crash functions, blind spot detection, fill level measurements, and distance measurements. For all the control—and regulation-related events, a sensor system—miniaturized as much as possible—must be available in the motor vehicle.

As a rule, for the above fields of application named as examples, contactless sensors are used, which output a measurement beam of a defined frequency which is reflected from the object to be measured and is detected again by means of a receiver unit and evaluated.

For fill level measurements, measuring instruments in the microwave range at about 2 to 24 GHz, which operate either on the FMCW principle or as pulse radar, are known. Such fill level sensors, for heavy-duty stationary use under problematic environmental conditions—for instance in containers with combustible substances or at high ambient temperatures—are realized on such carrier substrates as teflon or RT-Duriod. Also known are short-range radar systems for motor vehicles, which serve as parking aids or as precrash sensors and have a measurement frequency in the range of about 20 GHz.

For distance measurements up to ranges of 150 m, sensors employing various principles have been developed. Ultrasound instruments are very economical, but because the beam is not sharply focused they are relatively imprecise. Laser distance meters are substantially more-precise, but cannot be miniaturized arbitrarily and are very expensive. Distance sensors are also known with which measurements in the microwave range can be made. The sensors required for this are indeed based on semiconductor circuits, but the requisite excitation sources (oscillators) are installed in the semiconductor circuit only by retrofitting using conventional hybrid technology. A disadvantage of this is that the poor replicability of the coupling of the transmission units to the semiconductor circuit already limits the possible miniaturization. Moreover, the oscillators mounted retroactively on the semiconductor circuit must be calibrated, which is complicated. The precision of the measurements depends, among other factors, on the stability of the transmission frequency. Reference oscillators required for the frequency stabilization must then also be installed and calibrated.

ADVANTAGES OF THE INVENTION

The integrated semiconductor component for high-frequency measurements according to the invention makes it possible to realize distance measuring instruments that with very small dimensions make high-precision measurements possible. The semiconductor component is distinguished in that it is a component of a semiconductor circuit comprising a first silicon layer, an adjoining silicon dioxide layer (insulating layer) and a subsequent further silicon layer (structured layer) (SOI wafer). The semiconductor component comprises (a) an IMPATT oscillator, having a resonator which includes a metallized cylinder of silicon, disposed in the structured layer; a coupling disk covering the cylinder in the region of the first layer; and an IMPATT diode, communicating with the cylinder of the resonator via a recess in the coupling disk; and (b) a reference oscillator of lower frequency, having a resonator which includes a metal cylinder of silicon, disposed in the structured layer, and coupling disk covering the cylinder in the region of the first layer; and a microwave conductor, communicating with the cylinder of the resonator via a recess in the coupling disk, and the reference oscillator, via an active oscillator circuit, serves the purpose of frequency stabilization of the IMPATT oscillator;

c) with integrated Schottky diodes; and d) a transmitting and receiving antenna.

A system is thus created which assures measurement at very high operating frequencies, in the millimeter wave range (120 to 130 GHz). The measurement in the microwave range makes high beam focusing possible (less than ±5° of the full width at half-maximum, so that a quasi-optical antenna serving as a receiver unit can have a lens diameter of <30 mm. The semiconductor material used makes it possible to integrate the required planar components by microstrip line technology on the silicon membrane, etched open in the surroundings of the cylindrical resonators, or by coplanar technology on the surrounding silicon base substrate. All the passive components, such as micromechanically structured resonators, Schottky diodes and varactor diodes, as well as all the active components, such as IMPATT diodes, are integrated on the semi-insulating SOI wafer.

In particular, it is thus advantageously achieved that no connection with a high-frequency signal leads downward from the system. It is thus possible for a complete radar system to be integrated on one chip.

The IMPATT oscillator preferably generates a fixed frequency in the range from 80 to 500 GHz, in particular from 100 to 150 GHz. The reference oscillator is preferably designed for generating a fixed frequency in the range from 1 to 70 GHz, in particular from 20 to 50 GHz. The cylinders of the resonators are each covered by an aluminum layer approximately 1 μm thick as metallization. The coupling disks that cover the resonators are dimensioned such that no interfering transmission energy in the microwave range can escape from their edge.

In a preferred feature of the invention, the IMPATT oscillator is voltage-controlled, and a varactor diode is implanted for triggering purposes on the edge of the coupling disk. The voltage control of the IMPATT diode is preferably effected via two low-pass filters.

The conductor layer of the semiconductor circuit serves as a carrier substrate for a microstrip line circuit disposed over it. A patch antenna can be integrated with the semiconductor circuit. In a preferred monostatic embodiment, the patch antenna functions as a common, circularly polarized transmitting and receiving antenna. Naturally a bistatic embodiment with separate linearly or circularly polarized transmitting and receiving antennas is also conceivable.

Inputting the generated transmission energy of the IMPATT oscillator into the surrounding microstrip line circuit is done via a coupling element. In particular, branchline couplers for decoupling fractions of the transmission energy into the patch antenna and for frequency stabilization with the reference oscillator may be present. The active oscillator circuit can preferably be mounted as an additional semiconductor circuit on the semiconductor circuit by conventional hybrid technology, or it can be embodied as a discrete individual transistor. In the latter case, it is preferable for the requisite adaptation circuit to be integrated with the semiconductor circuit by coplanar or microstrip line technology. It is also advantageous to use a further branchline coupler for splitting a transmission signal into an in-phase component and a quadrature component. This coupler, in the case of a monostatic embodiment, additionally serves to separate the transmission and reception signals.

The semiconductor components of the invention are preferably used as components of a sensor for distance measurement. The sensor is intended to be used in particular in the motor vehicle for blind spot detection, precrash and side crash detection, distance measurement, or as a parking aid.

Further advantageous features of the invention will become apparent from the characteristics recited in the dependent claims.

DRAWINGS

The invention will be described in further detail below in terms of exemplary embodiments in conjunction with the associated drawings. Shown are.

DESCRIPTION OF THE EXEMPLARY EMBODIMENTS

Figure 1:
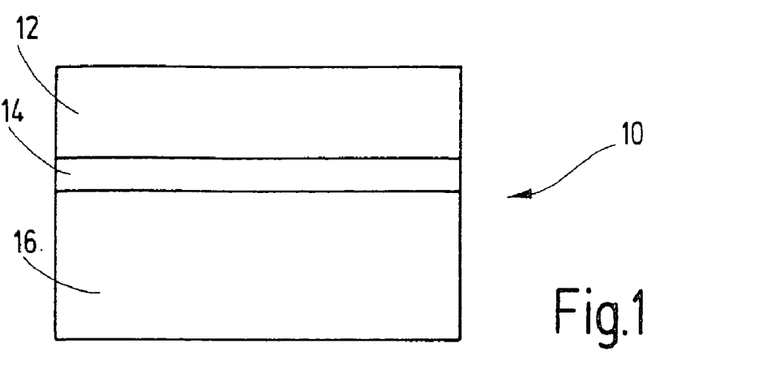
FIGS. 1 through 3, schematic sectional views through semiconductor components for high-frequency applications, in various stages of production.

FIG. 1, in a schematic sectional view, shows a detail of a commercially available SOI (silicon on insulator) wafer which is used to produce a semiconductor circuit 10 with the semiconductor components of the invention. The production, known from coplanar or planar technology, of all the components of the semiconductor circuit 10 in one common production step will not be described in further detail here—because it is well known. The wafer comprises a semi-insulating, p$^-$-doped structured layer 16 of silicon that is 675 µm thick. It has a specific resistance in the range from 500 to 1000 Ωcm, in particular 750 Ωcm. The structured layer 16 is covered with an insulating layer 14 of silicon dioxide, about 300 nm thick, over which a p$^-$-doped layer 12 of silicon, 50 µm thick, is applied.

Figure 2:
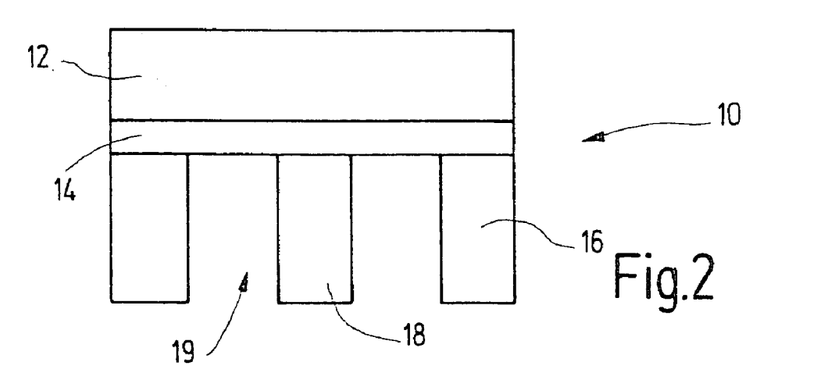

The silicon dioxide layer 14 serves as an etching stop in trench etching of the micromechanical structures into the structured layer 16. The trench etching process uncovers a membrane, comprising the precise 50-µm-thick layer 12 and the 300-nm-thick layer 14, thereby creating a free space 19 in the layer 16. A silicon cylinder 18 projects into this free space 19 (FIG. 2) and is quasi-surrounded by the free space 19. This structuring is possible by means of suitable masking during the trench etching.

Figure 3:
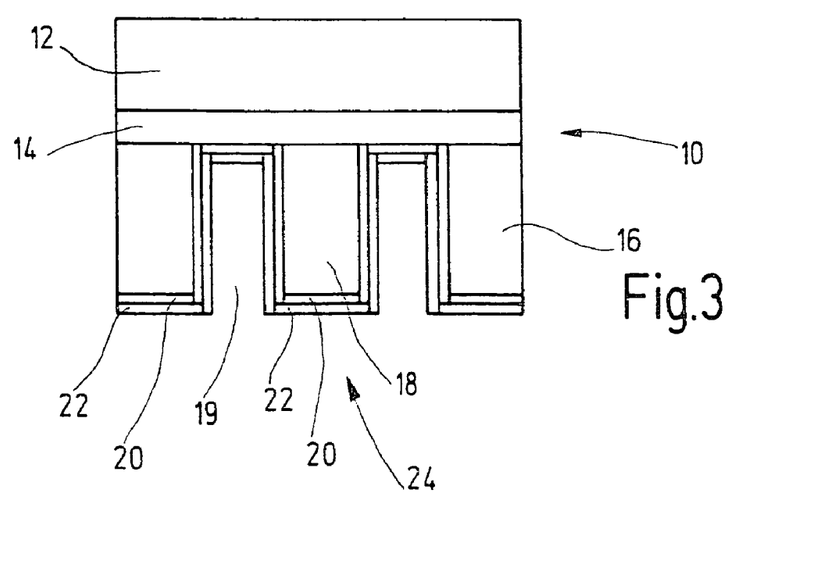

The resultant cylindrical structure 18 is coated by vapor deposition or sputtering with an aluminum layer 20 approximately 1 µm thick (FIG. 3). The thereby metallized cylinder 18 serves as a resonator 24 of high quality (Q≈200), filled with semi-insulating silicon, which depending on the conditions required can be excited in a targeted way in the $TM_{010}$ mode or the $TE_{111}$ mode. An additional copper layer in the region of the resonator 28 that is required for heat dissipation in conventional technology can be dispensed with.

Figure 4:
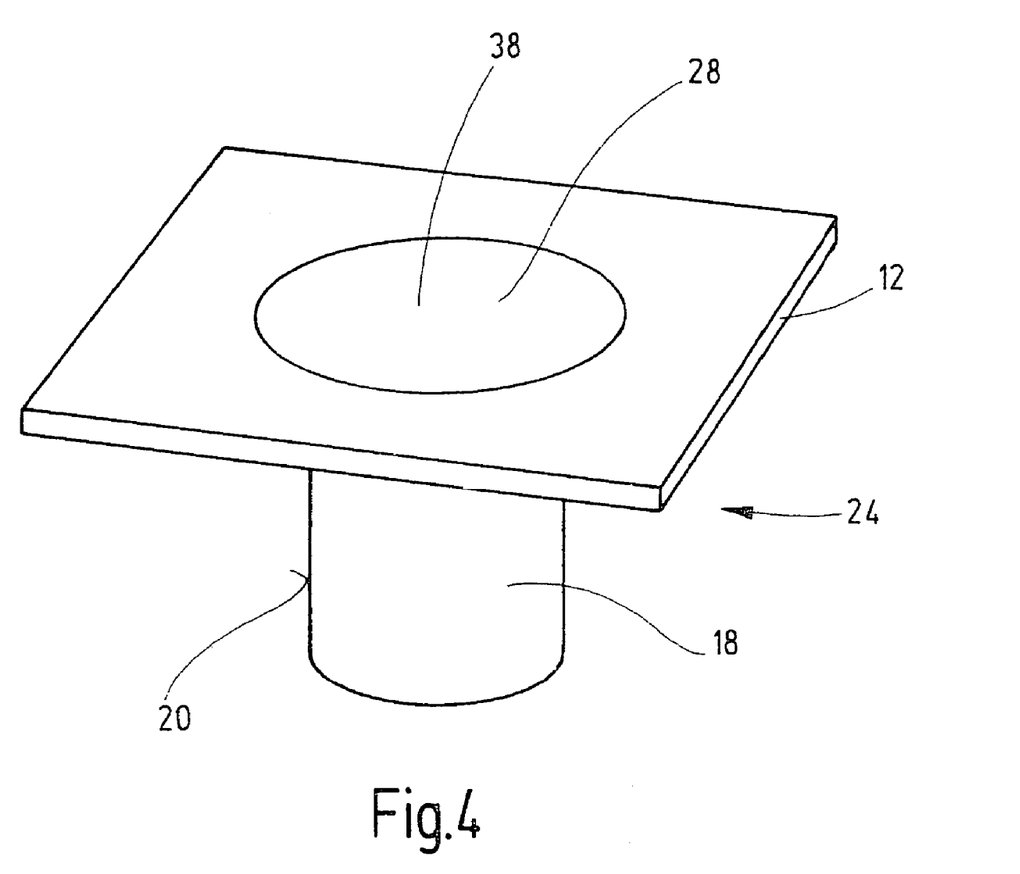
FIG. 4, a perspective side view on a resonator for an oscillator.

A region of the layer 12 above the cylinder 18 is vapor-deposited (FIG. 4) with a coupling disk 28, which extends past the cylinder 18 below it. In the coupling disk 28, a recess 38 is structured (in particular in the form of a slit). The coupling disk 28 is dimensioned such that no microwave energy can escape from its edge. The resonator 24 is suitable—given various dimensioning and voltage supply—as both a transmitter and a reference source. The resonator 24 for an IMPATT oscillator 30 to be described in further detail below has a height of approximately 725 µm and a radius, adapted to the desired resonator frequency of 122.3 GHz, of 242 µm. For a reference frequency of 40 GHz, the radius is 800 µm for a height of 725 µm.

Figure 5:
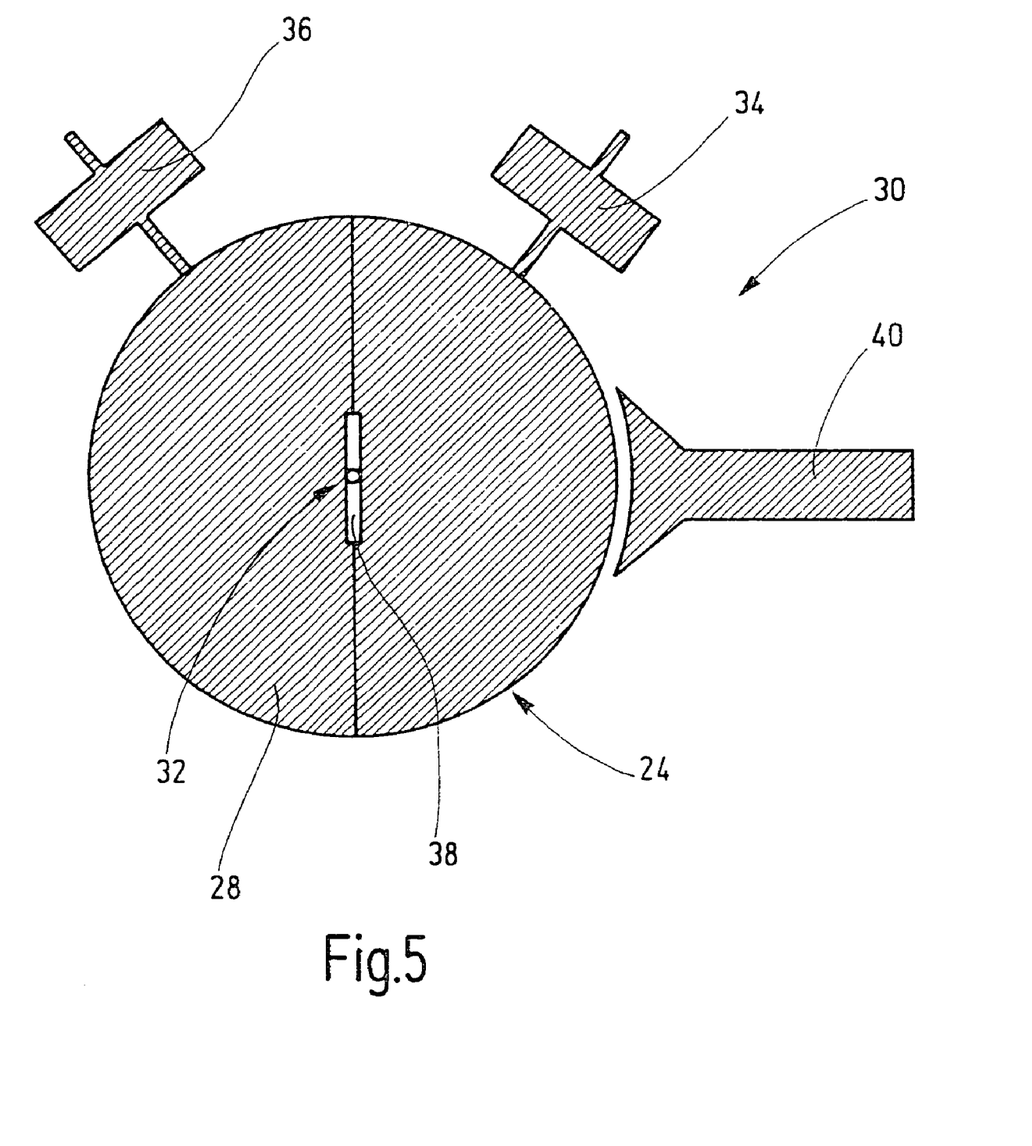
FIG. 5, a schematic plan view on an IMPATT oscillator.

FIG. 5 shows a plan view on an IMPATT oscillator 30 of the kind required to generate a transmission signal in the microwave range. Besides the resonator 24, the IMPATT oscillator 30 includes an IMPATT diode 32, which is supplied with voltage via two low-pass filters 34, 36. The IMPATT diode 32 is seated in the recess 38 in the coupling disk 28 and enables the connection with a microstrip line circuit integrated with the layer 12. The transmission energy generated by the IMPATT oscillator 30 is fed into the surrounding microstrip line circuit via a coupling element 40. The IMPATT oscillator 30 can be operated in the especially favorable $TE_{111}$ mode. For the case of a voltage controlled oscillator, in addition to the IMPATT diode 32, a varactor diode 42 is implanted on the edge of the coupling disk 28 (see FIG. 9).

Figure 6:
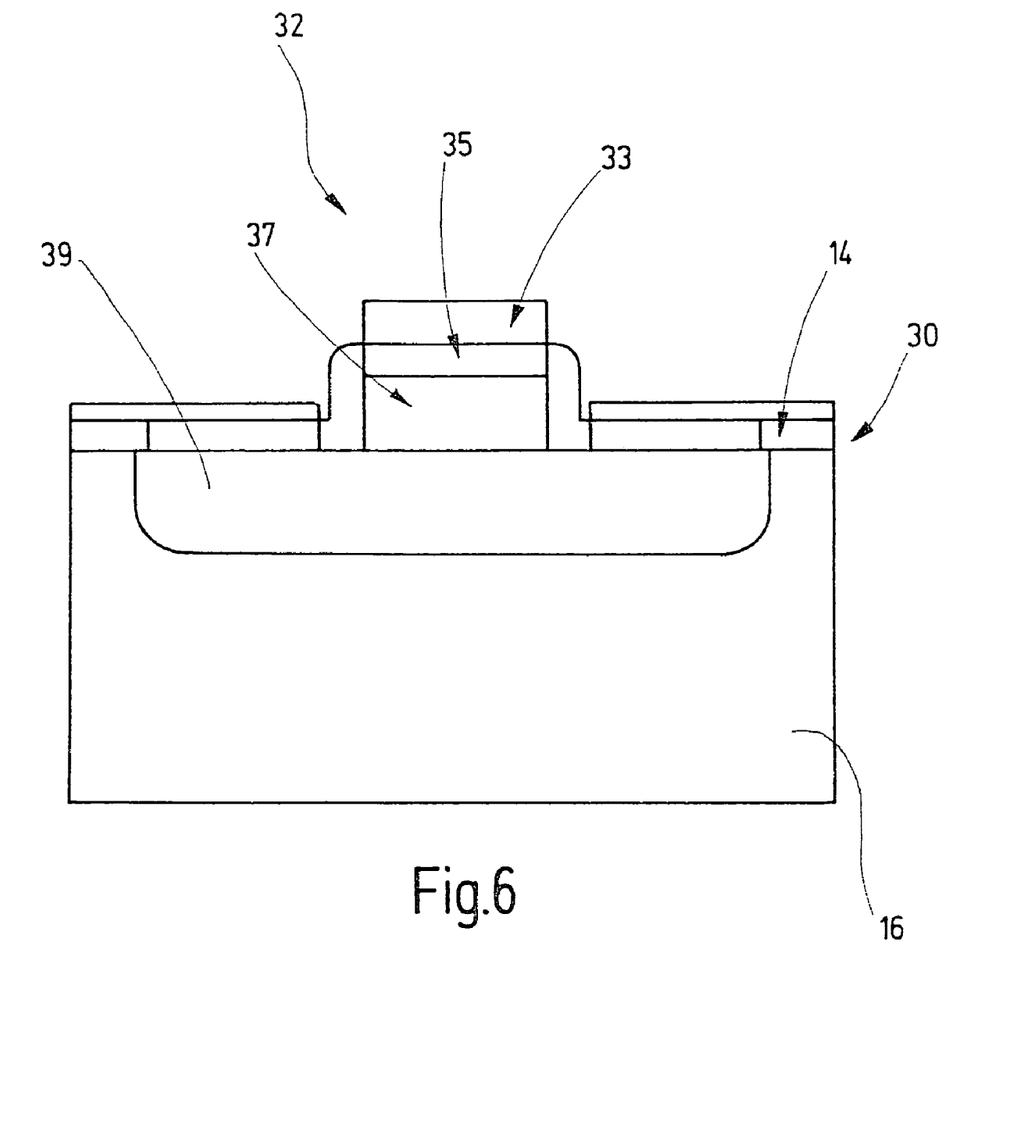
FIG. 6, a cross section through the semiconductor component in the region of an IMPATT diode.

FIG. 6 shows a cross section through the semiconductor circuit 10 in the region of the IMPATT diode 32. Such diodes are known, and a detailed description of the individual layers and function elements will therefore be dispensed with here. Successively, the IMPATT diode 32 includes an aluminum layer 33, a p$^+$-doped silicon layer 35, an episilicon layer 37, and an n$^+$-doped layer 39.

The layout of a reference oscillator 46 (FIG. 9) is in principle identical to the layout of the IMPATT oscillator 30. For operation in the $TM_{010}$ mode, however, the connection cannot be made via an IMPATT diode 32; instead, some other suitable middle conductor must be employed. The $TM_{010}$ mode makes it possible to generate especially stable reference signals.

Figure 7:
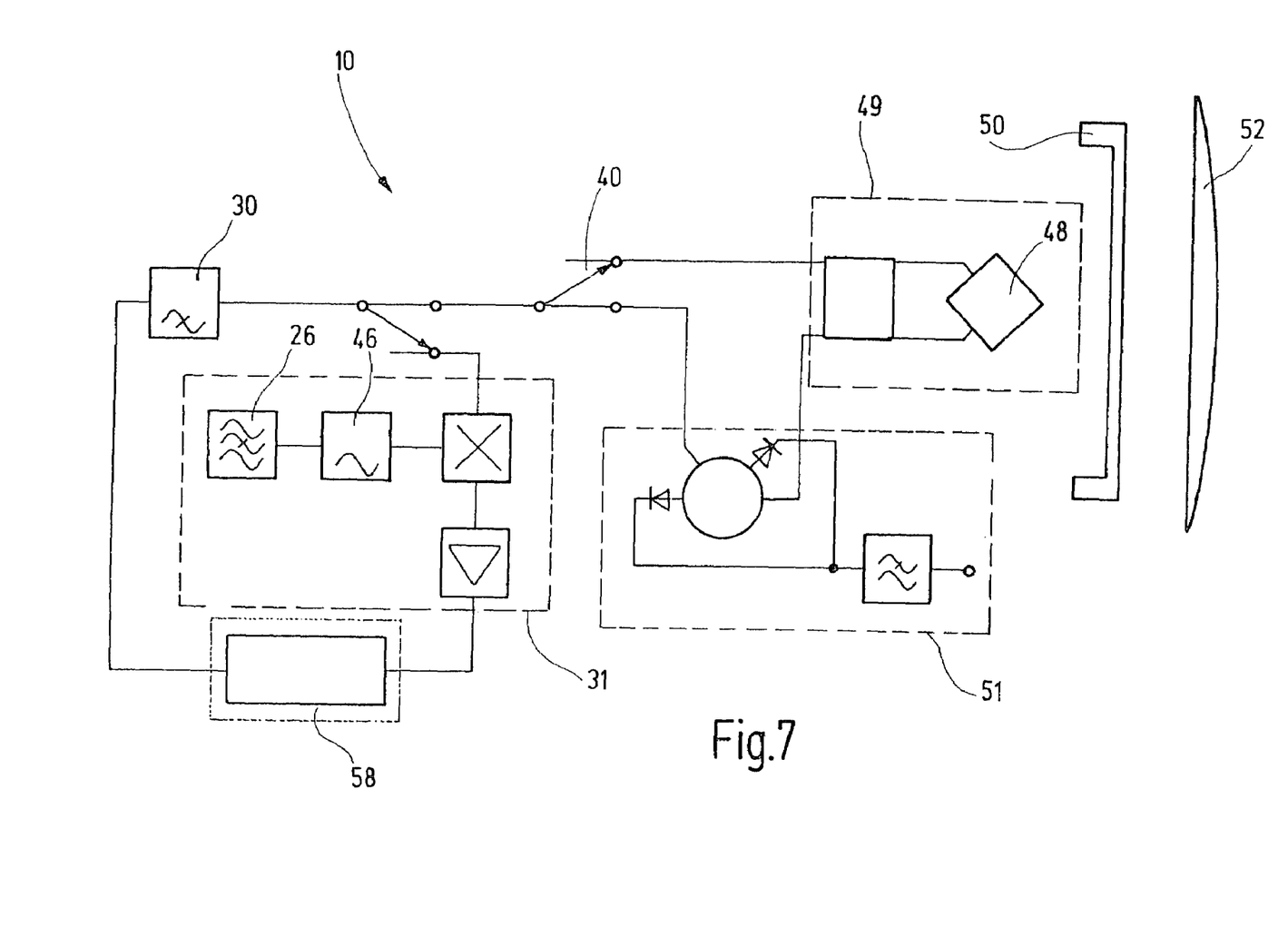
FIG. 7, a block circuit diagram of a monostatic embodiment.
Figure 8:
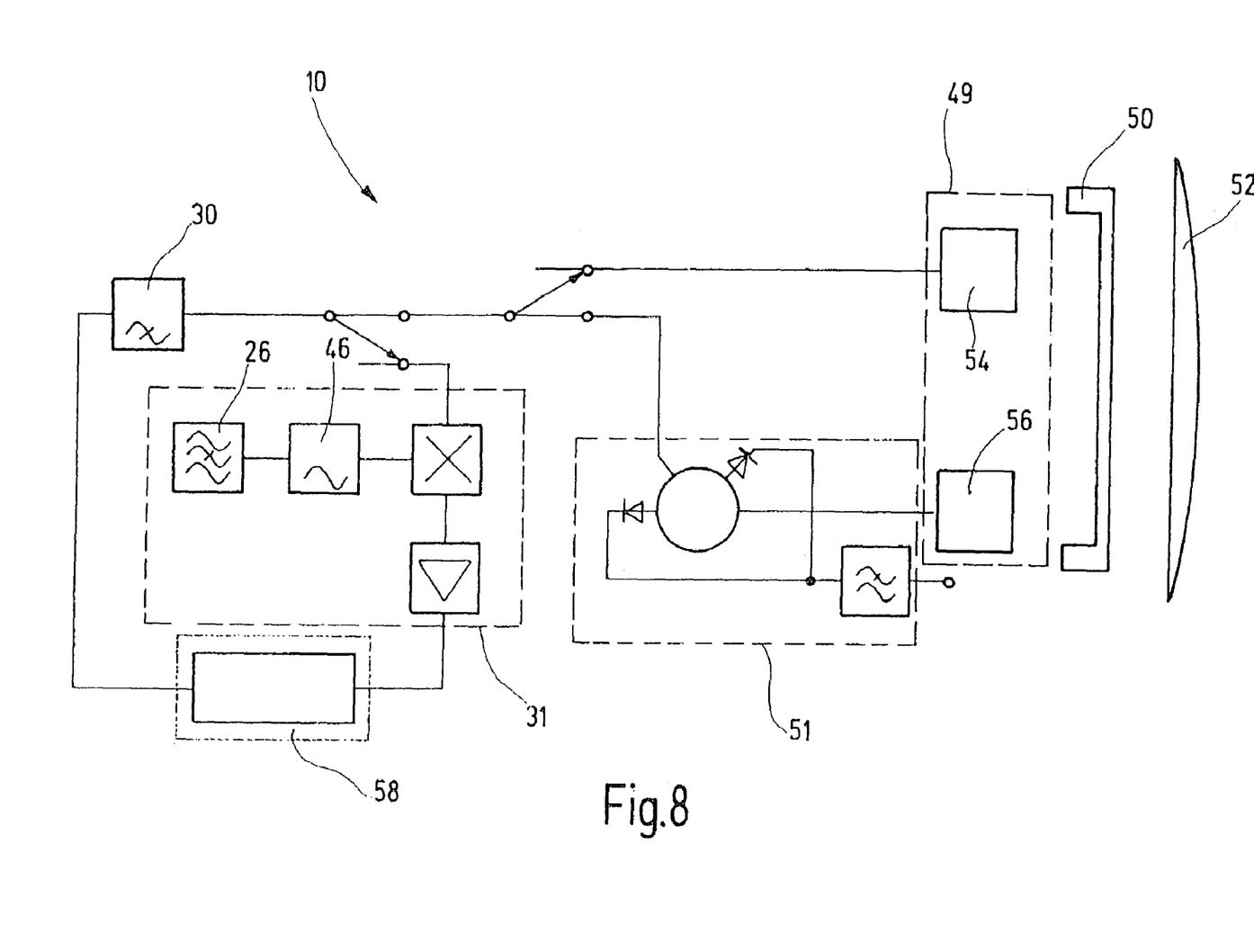
FIG. 8, a block circuit diagram of a bistatic embodiment.

FIG. 7 shows a block circuit diagram of a monostatic embodiment, with a common, circularly polarized transmitting and receiving antenna. The arrangement includes the IMPATT oscillator 30, which generates a high-frequency transmission signal in the range of 122 GHz, and the reference oscillator 46, which is used for frequency stabilization and frequency linearization. For those purposes, a fixed reference signal in the range of 40 GHz is generated. The transmission signal is input into a patch antenna 48 via a coupling 40. The entire semiconductor circuit 10 is protected against environmental factors by a superstrate 50 in the form of a housing, shown in suggested fashion. A lens 52, which may have a diameter of less than 30 mm, focuses the emitted measurement beam. In addition to the monostatic embodiment shown, transmitting and receiving antennas can also be realized in the form of separate linearly or circularly polarized units. Hence FIG. 8 shows a separate patch antenna 54 and a receiver antenna 56 independent of it.

FIG. 7 shows the primary components, which are the IMPATT oscillator (transmitter) 30, frequency processor 31 and reference source (reference oscillator 46), antenna system 49, and receiving mixer 51 with integrated IMPATT diodes. These are integrated onto a compact chip. No high-frequency connection (in the microwave range) is extended to the outside.

Figure 9:
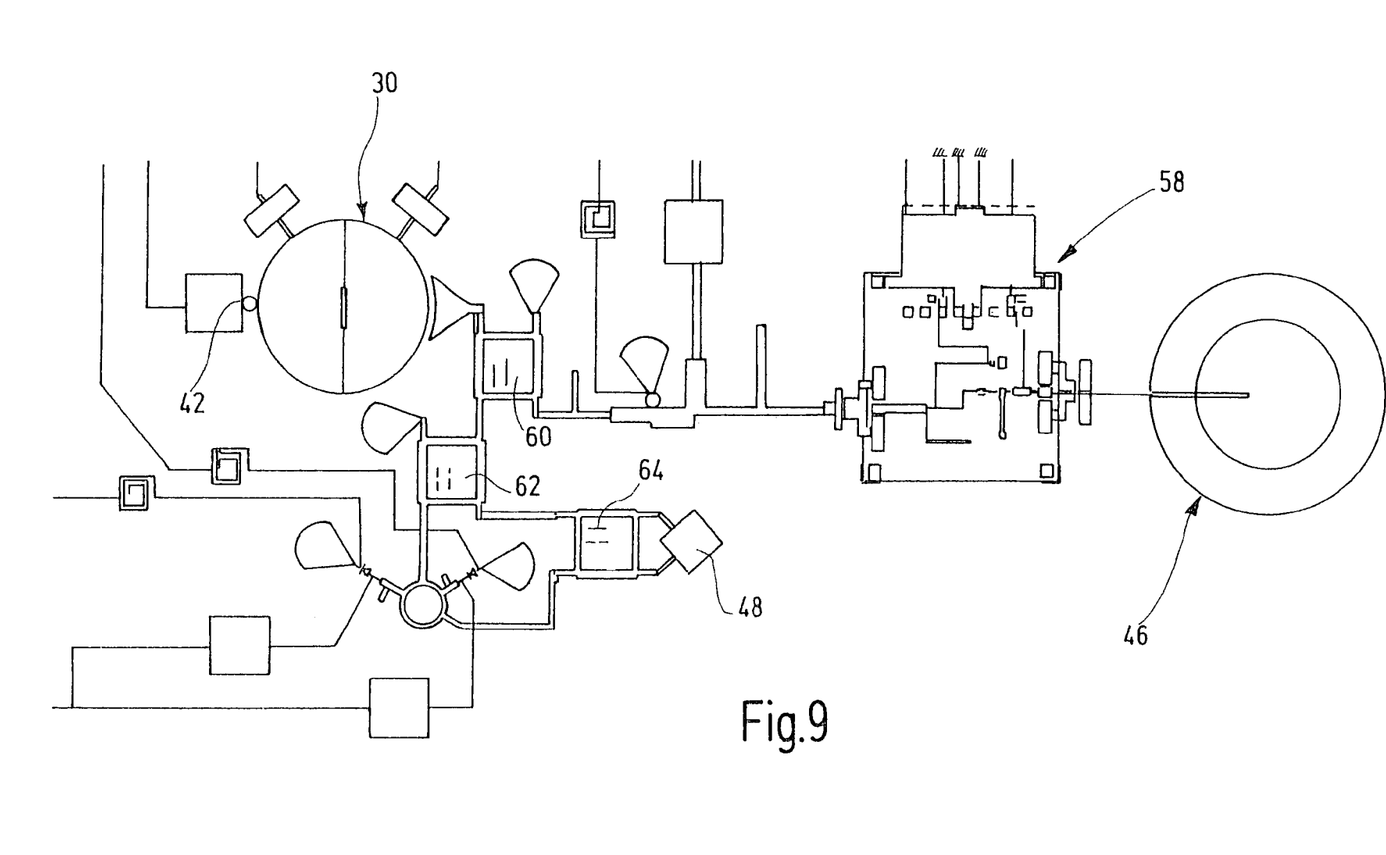
FIG. 9, a further illustration of a monostatic embodiment in accordance with FIG. 7.

Another view of the monostatic embodiment of FIG. 7, which is suitable for radar systems for distance measurement, is shown in FIG. 9. For the frequency stabilization, an active oscillator circuit 58 is present—in this case in the form of an additional GaAs semiconductor circuit mounted using flip-chip technology. Alternatively, the active oscillator circuit 58 can be realized by a conductively glued-on discrete individual transistor. The adaptation circuit required in that case can be likewise integrated with the layer 12 of the semiconductor circuit 10 by coplanar and microstrip line technology.

The transmission energy generated by the IMPATT oscillator 30 is used in portions, via branchline couplers 60, 62, for frequency stabilization with the reference oscillator 46. A further branchline coupler 64 splits the transmission signal into an in-phase component and a quadrature component, for supplying the circularly polarized patch antenna 48, and simultaneously accomplishes the separation of the transmission and reception signals in the monostatic system. A ratrace mixer is supplied at one input with the reception signal from the branchline coupler 64 and at its second input with the oscillator energy from the reference oscillator 46.

Figure 10:
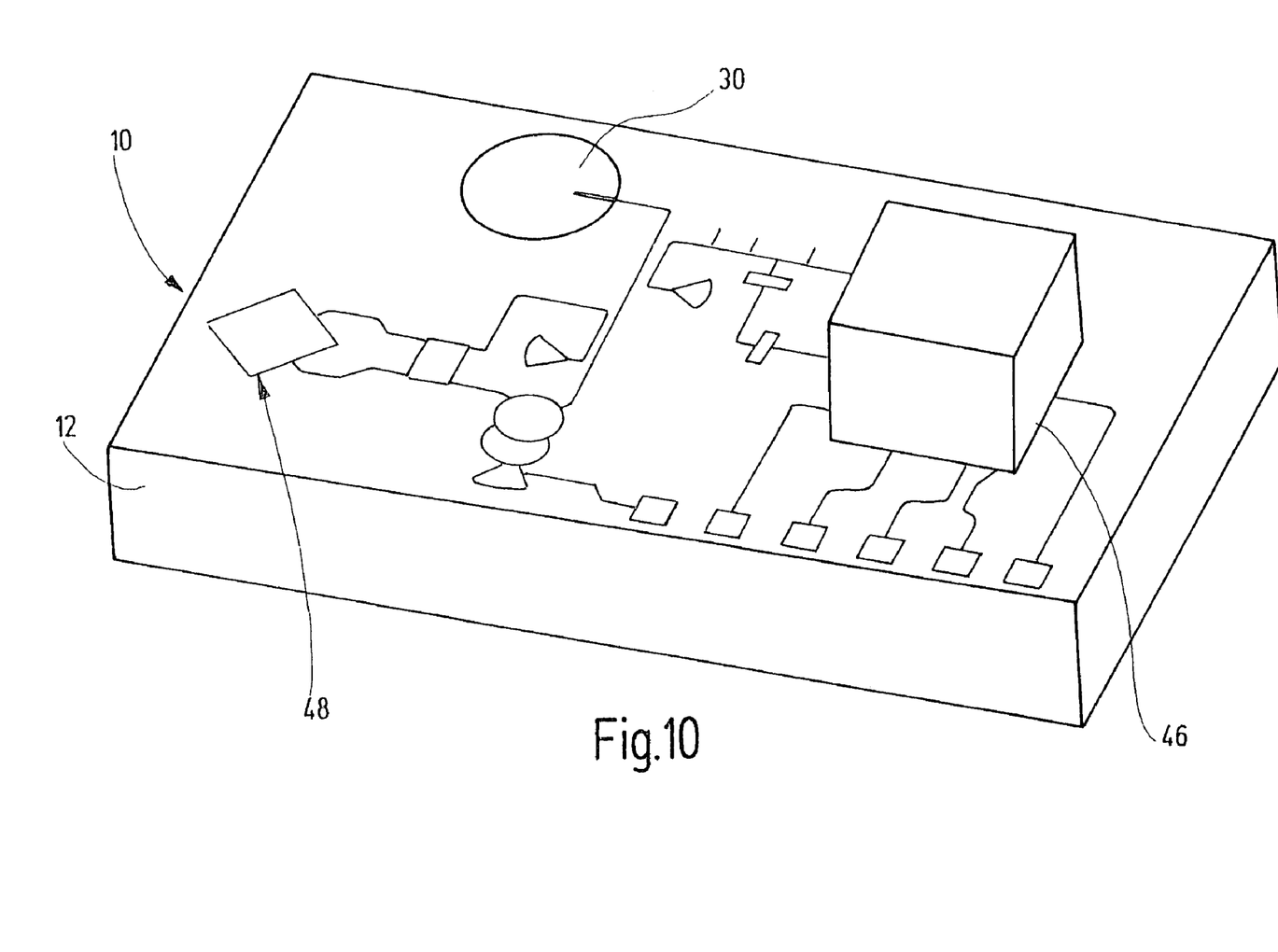
FIG. 10, an embodiment with a reference oscillator in an additionally mounted semiconductor circuit.

FIG. 10 shows a further embodiment, in which the oscillator 46 serving as a reference is mounted as an SiGe semiconductor circuit on the semiconductor circuit 10 by means of flip-chip bonding.

Figure 11:
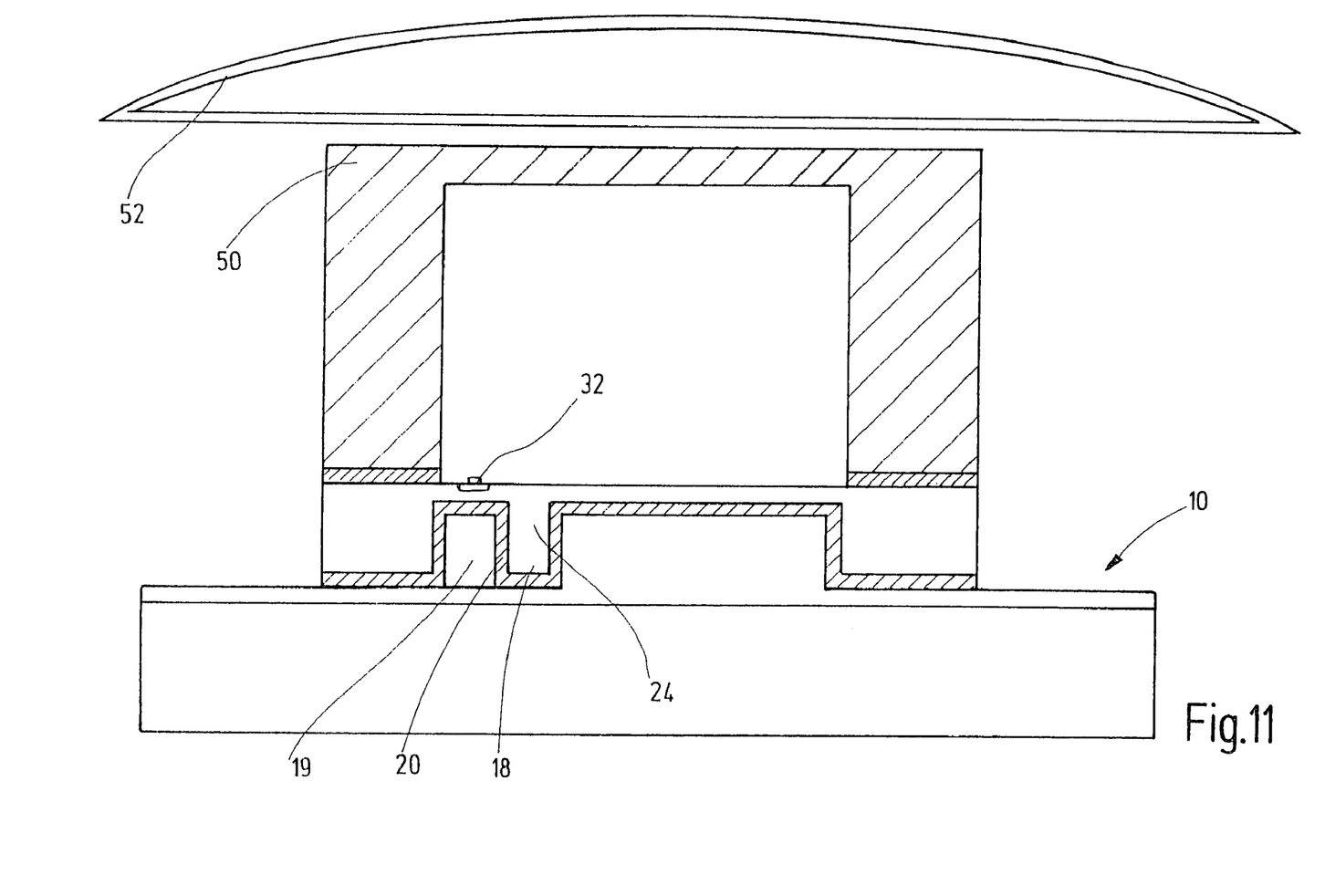
FIG. 11, a schematic layout of a sensor for distance measurement.

In FIG. 11, for the sake of illustration, the layout of a radar system with a substrate 50 and an antenna lens 52 is shown again schematically, not to scale.

The invention claimed is:

1. An integrated semiconductor component for high-frequency measurements, characterized in that the semiconductor component is a semiconductor circuit (10) comprising a first silicon layer (12), an adjoining silicon dioxide layer (insulating layer (14)) and a subsequent further silicon layer (structured layer (16)) (SOI wafer), and the semiconductor component comprises
    (a) an IMPATT oscillator (30), having a resonator (24) which includes a metallized cylinder (18) of silicon, disposed in the structured layer (16); a coupling disk (28) covering the cylinder (18) in the region of the first layer (12); and an IMPATT diode (32), communicating with the cylinder (18) of the resonator (24) via a recess (38) in the coupling disk (28); and
    (b) a reference oscillator (46) of lower frequency, having a resonator (24) which includes a metal cylinder (18) of silicon, disposed in the structured layer (16), and coupling disk (28) covering the cylinder in the region of the first layer (12); and a microwave conductor, communicating with the cylinder (18) of the resonator (24) via a recess (38) in the coupling disk (28), and the reference oscillator, via an active oscillator circuit (58), serves the purpose of frequency stabilization of the IMPATT oscillator (30);
    c) with integrated Schottky diodes; and
    d) a transmitting and receiving antenna (49).

2. The integrated semiconductor component in accordance with claim 1, characterized in that the IMPATT oscillator (30) generates a fixed frequency in the range from 80 to 500 GHz, in particular from 100 to 150 GHz.

3. The integrated semiconductor component in accordance with claim 1, characterized in that the reference oscillator (46) generates a fixed frequency in the range from 1 to 70 GHz, in particular from 30 to 50 GHz.

4. The integrated semiconductor component in accordance with claim 1, characterized in that the cylinders (18) of the resonators (24) are covered by a metal layer (20), in particular of aluminum.

5. The integrated semiconductor component in accordance with claim 4, characterized in that the coupling disks (28) of the resonators (24) are dimensioned such that no transmission energy can escape from their edge.

6. The integrated semiconductor component in accordance with claim 4, characterized in that the IMPATT oscillator (30) is voltage-controlled, and a varactor diode (42) is implanted on the edge of the coupling disk (28).

7. The integrated semiconductor component in accordance with claim 1, characterized in that the voltage supply to the IMPATT diode (32) is effected via two low-pass filters (32, 34).

8. The integrated semiconductor component in accordance with claim 1, characterized in that the layer (12) serves as a carrier substrate for a microstrip line circuit.

9. The integrated semiconductor component in accordance with claim 1, characterized in that the semiconductor circuit (10) has a patch antenna (48) as an integrated receiver.

10. The integrated semiconductor component in accordance with claim 9, characterized in that the patch antenna (48) serves as a common, circularly polarized transmitting and receiving antenna (monostatic embodiment).

11. The integrated semiconductor component in accordance with claim 1, characterized in that the reference oscillator (46) is component of an independent circuit mounted by hybrid technology on the semiconductor circuit (10).

12. The integrated semiconductor component in accordance with claim 1, characterized in that inputting of the generated transmitter energy of the IMPATT oscillator (30) into the surrounding microstrip line circuit is effected via a coupling element (40).

13. The integrated semiconductor component in accordance with claim 12, characterized in that branchline couplers (60, 62) are present for decoupling fractions of the transmitter energy into the patch antenna (48) and for frequency stabilization with the reference oscillator (48).

14. The integrated semiconductor component in accordance with claim 1, characterized in that the active oscillator circuit (58) is an additional semiconductor circuit.

15. The integrated semiconductor component in accordance with claim 1, characterized in that the active oscillator circuit (58) is a discrete individual transistor.

16. The integrated semiconductor component in accordance with claim 15, characterized in that the requisite adaptation circuit is integrated by coplanar or microstrip line technology into the semiconductor circuit (10).

17. The integrated semiconductor component in accordance with claim 1, characterized in that a further branchline coupler (64) is present for splitting a transmission signal into an in-phase component and a quadrature component.

18. The integrated semiconductor component in accordance with claim 17, characterized in that the further branchline coupler (64), in the monostatic embodiment, serves to separate the transmission and reception signals.

19. The use of the integrated semiconductor component in accordance with claim 1, characterized in that the semiconductor component is a component of a sensor for distance measurement.

20. The use in accordance with claim 19, characterized in that the sensor is employed in a motor vehicle for blind spot detection, precrash and side crash detection, parking assistance, and distance measurement.

* * * * *